United States Patent
Lin (10) Patent No.: US 11,799,490 B2
(45) Date of Patent: Oct. 24, 2023

(54) SIGNAL CONVERTER DEVICE, DYNAMIC ELEMENT MATCHING CIRCUIT, AND DYNAMIC ELEMENT MATCHING METHOD

(71) Applicant: REALTEK SEMICONDUCTOR CORPORATION, Hsinchu (TW)

(72) Inventor: Sheng-Hsiung Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 9 days.

(21) Appl. No.: 17/720,754

(22) Filed: Apr. 14, 2022

(65) Prior Publication Data

US 2023/0024276 A1 Jan. 26, 2023

(30) Foreign Application Priority Data

Jul. 22, 2021 (TW) .................................. 110127029

(51) Int. Cl.
- H03M 1/06 (2006.01)
- H03M 7/16 (2006.01)
- H03M 1/68 (2006.01)

(52) U.S. Cl.
CPC ........... *H03M 1/066* (2013.01); *H03M 1/682* (2013.01); *H03M 7/165* (2013.01)

(58) Field of Classification Search
CPC .............. H03M 1/06; H03M 1/16; H03M 1/68
See application file for complete search history.

(56) References Cited

U.S. PATENT DOCUMENTS

| | | | |
|---|---|---|---|
| 6,304,608 B1 | 10/2001 | Chen et al. | |
| 6,958,722 B1* | 10/2005 | Janakiraman | H03M 1/144 341/161 |
| 9,705,512 B1* | 7/2017 | Kuan | H03L 7/0898 |
| 10,020,816 B1* | 7/2018 | Cleris | H03K 5/24 |
| 10,158,374 B1* | 12/2018 | Lai | H03M 3/464 |
| 10,630,304 B1* | 4/2020 | Trivedi | H03M 1/662 |
| 2013/0021181 A1* | 1/2013 | Shah | H03M 1/0692 341/110 |
| 2015/0318862 A1* | 11/2015 | Feddeler | H03M 1/38 341/155 |

(Continued)

FOREIGN PATENT DOCUMENTS

TW 425774 B 3/2001

OTHER PUBLICATIONS

K. Obata, K. Matsukawa, T. Miki, Y. Tsukamoto and K. Sushihara, "A 97.99 dB SNDR, 2 kHz BW, 37.1 µW noise-shaping SAR ADC with dynamic element matching and modulation dither effect," 2016 IEEE Symposium on VLSI Circuits (VLSI-Circuits), 2016, pp. 1-2, doi: 10.1109/VLSIC.2016.7573463.

M. Miyahara and A. Matsuzawa, "An 84 dB dynamic range 62.5-625 kHz bandwidth clock-scalable noise-shaping SAR ADC with open-loop integrator using dynamic amplifier," 2017 IEEE Custom Integrated Circuits Conference (CICC), 2017, pp. 1-4, doi: 10.1109/CICC.2017.7993655.

(Continued)

*Primary Examiner* — Lam T Mai
(74) *Attorney, Agent, or Firm* — WPAT, P.C (57) ABSTRACT

A dynamic element method includes the following operations: summing up most significant bits of a digital code in a previous period and a pointer signal in the previous period, in order to generate a first signal; outputting the first signal to be an adjusted pointer signal according to a clock signal; and decoding the adjusted pointer signal to be control signals, in which the control signals are configured to set corresponding relations of components of a first digital to analog converter circuits and the most significant bits, in order to utilize the components to convert the most significant bits.

20 Claims, 5 Drawing Sheets

(56) References Cited

U.S. PATENT DOCUMENTS

| | | | | |
|---|---|---|---|---|
| 2017/0359081 A1* | 12/2017 | Chen | .................. | H03M 1/0697 |
| 2018/0159550 A1* | 6/2018 | Zhou | ...................... | H03M 3/37 |
| 2019/0181880 A1* | 6/2019 | Huang | .................. | H03M 3/428 |
| 2019/0207616 A1* | 7/2019 | Chen | .................. | H03M 1/1014 |
| 2019/0253062 A1* | 8/2019 | Zare Hoseini | ...... | H03M 1/0697 |
| 2020/0028519 A1* | 1/2020 | Hsiao | .................. | H03M 1/0665 |
| 2020/0044639 A1* | 2/2020 | Lin | .................. | H03K 3/356173 |
| 2021/0223112 A1* | 7/2021 | Tu | ............................ | G01K 7/01 |
| 2021/0328596 A1* | 10/2021 | Huang | .................... | H03M 1/54 |
| 2022/0158648 A1* | 5/2022 | Huang | .................. | H03M 1/122 |
| 2022/0209781 A1* | 6/2022 | Huang | ................ | H03M 1/1215 |
| 2023/0116785 A1* | 4/2023 | Yang | .................. | H03M 1/1245 |
| | | | | 341/143 |

OTHER PUBLICATIONS

Y. Hwang, Y. Song, J. Park and D. Jeong, "A 0.6-to-1V 10k-to-100kHz BW 11.7b-ENOB Noise-Shaping SAR ADC for IoT sensor applications in 28-nm CMOS," 2018 IEEE Asian Solid-State Circuits Conference (A-SSCC), 2018, pp. 247-248, doi: 10.1109/ASSCC.2018.8579290.

OA letter of a counterpart TW application (appl. No. 110127029) mailed on Aug. 11, 2022. Summary of the TW OA letter: 1. Claims 9-10 are rejected as allegedly being anticipated by cited reference 1 (TW 425774 B, which is also published as U.S. Pat. No. 6,304,608B1). 2. Claims 1-8 are allowable. PS.Correspondence between claims of TW counterpart application and claims of US application: Claims 1-10 in TW counterpart application correspond to claims 1-3, 5-9, 11, and 16 in US application, respectively.

* cited by examiner

SIGNAL CONVERTER DEVICE, DYNAMIC ELEMENT MATCHING CIRCUIT, AND DYNAMIC ELEMENT MATCHING METHOD

BACKGROUND OF THE INVENTION

1. Field of the Invention

The present disclosure relates to a signal converter device, especially to an analog to digital converter and/or a digital to analog converter that employ a technique of dynamic element matching, a dynamic element matching circuit and a dynamic element matching method thereof.

2. Description of Related Art

In practical applications, mismatches may present among components in a digital to analog converter due to process variation(s), which results in a poor linearity of the digital to analog converter. In some relevant approaches, a technique of dynamic element matching is proposed to improve the linearity of the digital to analog converter. However, in those approaches, operations of the dynamic element matching are performed based on a thermometer code mode. As a result, a control circuit in the system requires an additional thermometer code decoder circuit, which results in a higher hardware cost. Moreover, in some related approaches, if the technique of dynamic element matching is employed in an analog to digital converter, operations of the dynamic element matching is required to be performed after the analog to digital converter generates one bit, which results in a lower sampling rate of the analog to digital converter.

SUMMARY OF THE INVENTION

In some aspects of the present disclosure, a signal converter device includes a first digital to analog converter circuit including a plurality of components, a second digital to analog converter circuit, and a dynamic element matching circuit. The first digital to analog converter circuit is configured to utilize the components to generate a first signal component of a first signal in response to first bits. The second digital to analog converter circuit is configured to generate a second signal component of the first signal in response to a second bit, in which weights corresponding to the first bits are higher than a weight corresponding to the second bit. The dynamic element matching circuit is configured to generate an adjusted pointer signal in response to a pointer signal and the first bits in a previous period, in order to set corresponding relations between the components and the first bits.

In some aspects of the present disclosure, a dynamic element matching circuit includes an arithmetic logic unit circuit, a register circuit, and a decoder circuit. The arithmetic logic unit circuit is configured to sum up most significant bits of a digital code in a previous period and a pointer signal in the previous period, in order to generate a first signal. The register circuit is configured to output the first signal to be an adjusted pointer signal according to a clock signal. The decoder circuit is configured to decode the adjusted pointer signal to be control signals, in which the control signals are configured to set corresponding relations of components of a first digital to analog converter circuits and the most significant bits, in order to utilize the components to convert the most significant bits.

In some aspects of the present disclosure, a dynamic element matching method includes the following operations: summing up most significant bits of a digital code in a previous period and a pointer signal in the previous period, in order to generate a first signal; outputting the first signal to be an adjusted pointer signal according to a clock signal; and decoding the adjusted pointer signal to be control signals, in which the control signals are configured to set corresponding relations of components of a first digital to analog converter circuits and the most significant bits, in order to utilize the components to convert the most significant bits.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
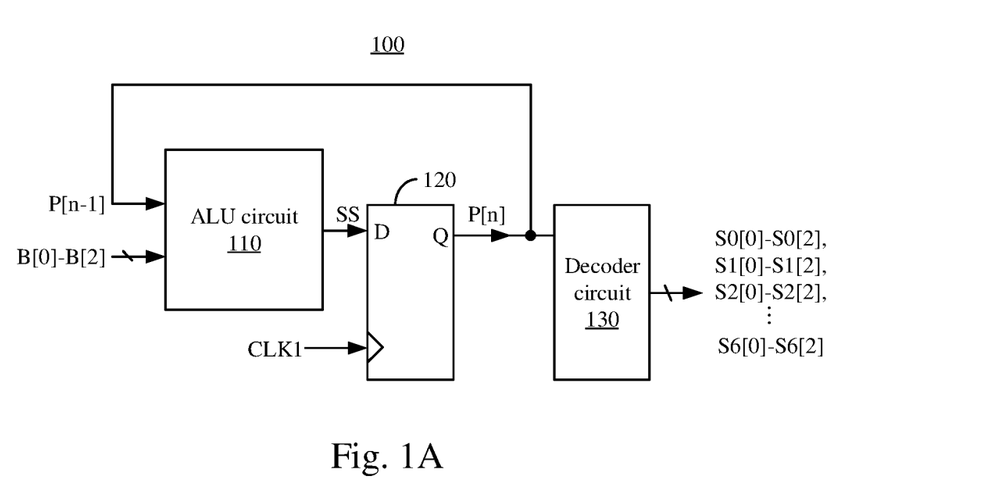
FIG. 1A shows a schematic diagram of a dynamic element matching circuit according to some embodiments of the present disclosure.
Figure 1B:
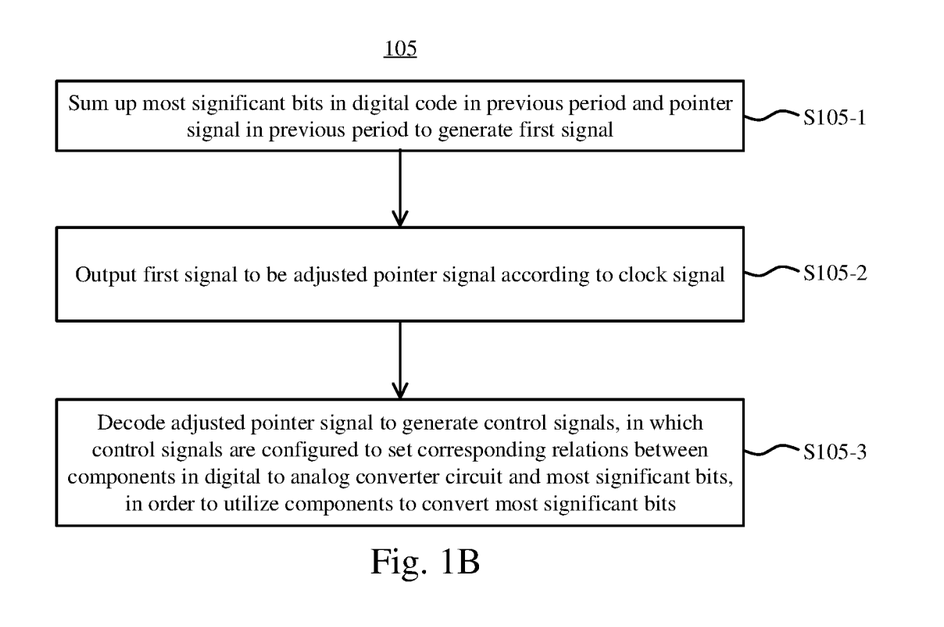
FIG. 1B shows a flow chart of a dynamic element matching method according to some embodiments of the present disclosure.

FIG. 1A shows a schematic diagram of a dynamic element matching (hereinafter referred to as "DEM" for simplicity) circuit 100 according to some embodiments of the present disclosure. FIG. 1B shows a flow chart of a DEM method 105 according to some embodiments of the present disclosure. In some embodiments, the DEM method 105 may be, but not limited to, performed by the DEM circuit 100. In some embodiments, the DEM method 105 may be implemented with software. In different embodiments, the DEM circuit 100 may be applied to a signal converter device (which may be, for example, an analog to digital converter or a digital to analog converter), in order to improve the linearity of the signal converter device. For ease of understanding, the following descriptions are given with reference to the DEM method 105 to illustrate relevant operations of the DEM circuit 100.

In operation S105-1, most significant bits of a digital code in a previous period and a pointer signal in a previous period are summed up, in order to generate a first signal (e.g., a signal SS). For example, as shown in FIG. 1A, the DEM circuit 100 includes an arithmetic logic unit (hereinafter referred to as "ALU" for simplicity) circuit 110, a register circuit 120, and a decoder circuit 130. The ALU circuit 110 is configured to sum up high-weight bits (e.g., most significant bits B[0]-B[2]) of a digital code (e.g., a digital code DC in FIG. 2A or FIG. 3) in a previous period (e.g., period T[n−1]) and a pointer signal (labeled as P[n−1]) in the previous period, in order to generate the signal SS. In some embodiments, the ALU circuit 110 may be implemented with one or more adder circuits and a calculation circuit for processing overflow calculation.

In operation S105-2, the first signal is outputted to be an adjusted pointer signal according to a clock signal. For example, as shown in FIG. 1A, the register circuit 120 is configured to store the signal SS, and output the signal SS to be the adjusted pointer signal (labeled as P[n]) according to the clock signal CLK1. It is understood that, in a next period (e.g., period T[n+1]), the register circuit 120 will output the pointer signal P[n] to the ALU circuit 110, in order to continue adjusting the pointer signal. In some embodiments, the register circuit 120 may be, but not limited to, implemented with a D-type flip flop circuit.

In operation S105-3, the adjusted pointer signal is decoded to generate control signals, in which the control signals are configured to set corresponding relations between components in a digital to analog converter circuit and the most significant bits, in order to utilize the components to convert the most significant bits. For example, as shown in FIG. 1A, the decoder circuit 130 may decode the adjusted pointer signal P[n], in order to generate control signals S0[0]-S0[2], S1[0]-S1[2], S2[0]-S2[2], 53[0]-53[2], S4[0]-S4[2], S5[0]-S5[2], and S6[0]-S6[2] (some of these signals are omitted in the figure). As a result, the digital to analog converter circuit may select one or more components (e.g., passive components including resistors, capacitors, or the like and/or active components including transistors, current cells, or the like) according to the control signals S0[0]-S0[2], S1[0]-S1[2], S2[0]-S2[2], S3[0]-S3[2], S4[0]-S4[2], S5[0]-S5[2], and S6[0]-S6[2], and utilize the selected component(s) to convert the most significant bits B[0]-B[2].

The arrangements of setting the corresponding relations between the components and the most significant bits will be described with reference to FIG. 2D. The decoding operation of the decoder circuit 130 can be set based on examples shown by FIG. 2D.

The above operations can be understood with reference to the above embodiments, and thus the repetitious descriptions are not given. The above description of the DEM method 105 includes exemplary operations, but the operations of the DEM method 105 are not necessarily performed in the order described above. Operations of the DEM method 105 can be added, replaced, changed order, and/or eliminated, or the operations of the DEM method 105 can be executed simultaneously or partially simultaneously as appropriate, in accordance with the spirit and scope of various embodiments of the present disclosure.

Figure 2A:
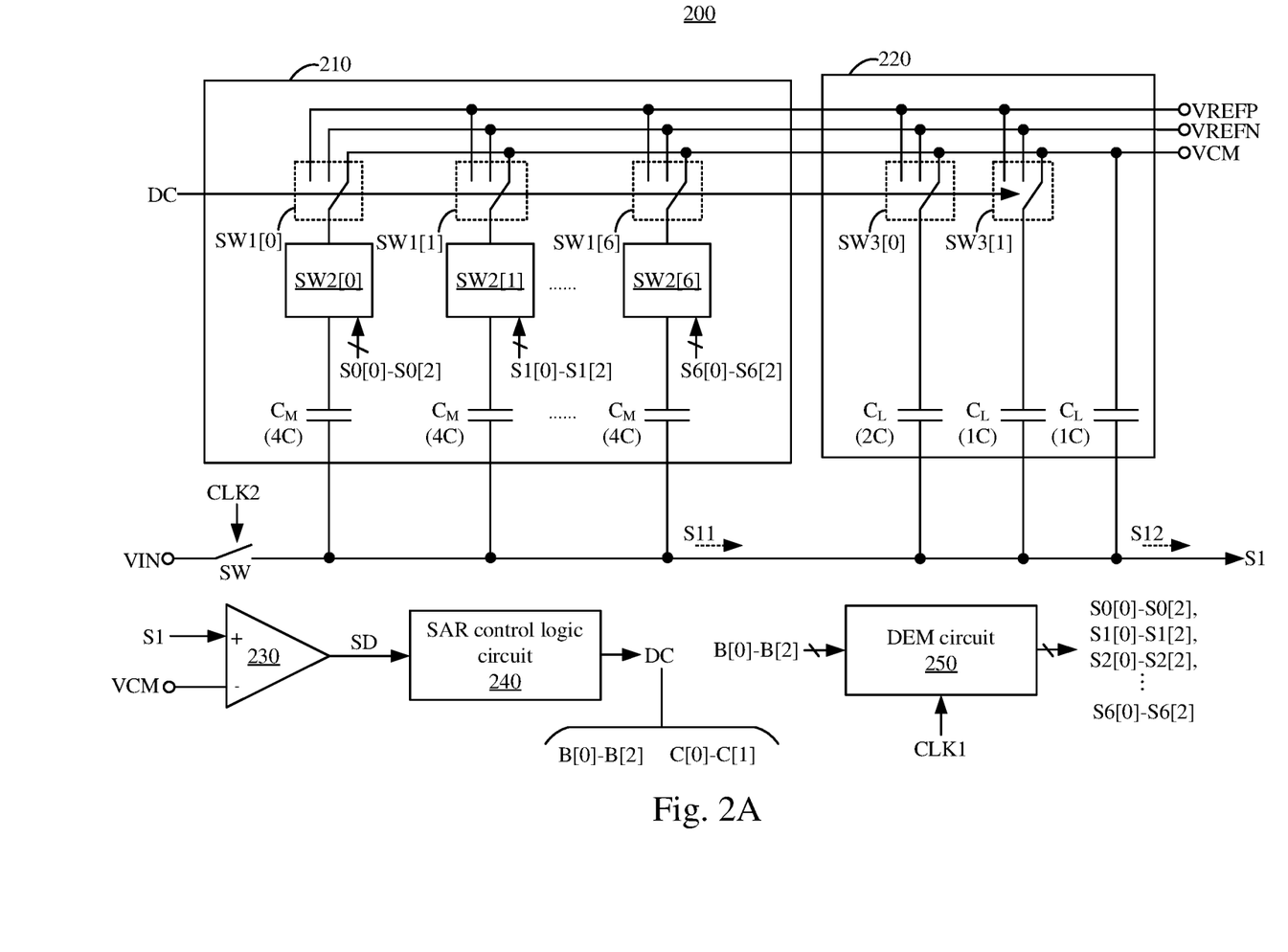
FIG. 2A shows a schematic diagram of a signal converter device according to some embodiments of the present disclosure.

FIG. 2A shows a schematic diagram of a signal converter device 200 according to some embodiments of the present disclosure. In this example, the signal converter device 200 may be a successive approximation register (hereinafter referred to as "SAR" for simplicity) analog to digital converter, which is configured to convert the input signal VIN into the digital code DC, in which the digital code DC includes high-weight bits (e.g., the most significant bits B[0]-B [2]) and low-weight bits (e.g., the least significant bits C[0]-C[1]).

The signal converter device 200 includes a switch SW, a digital to analog converter circuit 210, a digital to analog converter circuit 220, a comparator circuit 230, a SAR control logic circuit 240, and a DEM circuit 250.

The switch SW is configured to be selectively turned on according to a clock signal CLK2. When the switch SW is turned on, the digital to analog converter circuit 210 and the digital to analog converter circuit 220 may sample the input signal VIN. When the switch SW is not turned on, the digital to analog converter circuit 210, the digital to analog converter circuit 220, the comparator circuit 230, and the SAR control logic circuit 240 may perform the analog to digital conversion based on the sampled input signal VIN, in order to generate the digital code DC.

The digital to analog converter circuit 210 is configured to process the high-weight bits, and the digital to analog converter circuit 220 is configured to process the low-weight bits. The digital to analog converter circuit 210 is configured to utilize components (e.g., capacitors $C_M$) in response to the most significant bits B[0]-B[2] to generate a signal component S11. In greater detail, the digital to analog converter circuit 210 includes switching circuit SW1[0]-SW1[6], switching circuit SW2[0]-SW2[6], and the capacitors $C_M$. The switching circuit SW1[0] is coupled to the switching circuit SW2[0], and is coupled to one capacitor $C_M$ via the switching circuit SW2[0]. The switching circuit SW1[0] is configured to selectively receive a reference voltage VREFP, a reference voltage VREFN, or a common mode voltage VCM according to the digital code DC, and transmit the received voltage to the switching circuit SW2[0]. The switching circuit SW2[0] is coupled between a first terminal of the capacitor $C_M$ and the switching circuit SW1[0], and is configured to be selectively turned on according to the control signals S0[0]-S0[2].

Similarly, the switching circuit SW1[1] is coupled to the switching circuit SW2[1], and is coupled to another capacitor $C_M$ via the switching circuit SW2[1]. The switching circuit SW1[1] is configured to selectively receive the reference voltage VREFP, the reference voltage VREFN, or the common mode voltage VCM according to the digital code DC, and transmits the received voltage to the switching circuit SW2[1]. The switching circuit SW2[1] is coupled between the first terminal of the capacitor $C_M$ and the switching circuit SW1[0], and is configured be selectively turn according to the control signals S1[0]-S1[2]. With this analogy, the arrangements among the remaining switching circuit SW1[2]-SW[6], the switching circuits SW2[2]-SW2[6], and the capacitors $C_M$ can be understood with reference to FIG. 2A, and thus the repetitious descriptions are not further given. In greater detail, the switching circuits SW1[0]-SW1[6] are controlled based on the high-weight bits (e.g., the most significant bits B[0]-B[2]) in the digital code DC, and the switching circuits SW3[0]-SW3[1] are controlled based on the low weighed bits (e.g., the least significant bits C[0]—C[1]) in the digital code DC. In some embodiments, the SAR control logic circuit 240 may encode the high-weight bits to generate signals for controlling the switching circuit SW1[0]-SW1[6]. Second terminals of the capacitors $C_M$ are coupled to the switch SW and an input terminal of the comparator circuit 230. Based on the control of the SAR control logic circuit 240 and the DEM circuit 250, the digital to analog converter circuit 210 may output the corresponding signal component S11 via the second terminals of the capacitors $C_M$.

The digital to analog converter circuit 220 is configured to generate a signal component S12 in response to the least significant bits C[0]—C[1]. The digital to analog converter circuit 220 includes switching circuits SW3[0]-SW3[1] and capacitors $C_L$. The switching circuit SW3[0] is coupled to one capacitor $C_L$ (which has a capacitance value of 2 C). The switching circuit SW3[0] is configured to selectively receive the reference voltage VREFP, the reference voltage VREFN, or the common mode voltage VCM, and transmit the received voltage to the corresponding capacitor $C_L$. Similarly, the switching circuit SW3[1] is coupled to another capacitor $C_L$ (which has a capacitance value of 1 C). A terminal of the remaining capacitor $C_L$ (which has a capacitance value of 1 C) receives the common mode voltage VCM. The switching circuit SW3[1] is configured to selectively receive the reference voltage VREFP, the reference voltage VREFN, or the common mode voltage VCM, and transmit the received voltage to the corresponding capacitor $C_L$.

Second terminals of the capacitors $C_L$ are coupled to the switch SW and the input terminal of the comparator circuit 230. Based on the control of the SAR control logic circuit 240, the digital to analog converter circuit 220 may output the corresponding signal component S12 via the second terminals of the capacitors $C_L$. The signal component S11 and the signal component S12 can be summed up at the input terminal of the comparator circuit 230, in order to generate the signal S1.

In some embodiments, each of the digital to analog converter circuit 210 and the digital to analog converter circuit 220 may be a non-thermometer code digital to analog converter. In some embodiments, the non-thermometer code may include (but not limited to) binary code, non-binary code, and so on. In examples of FIG. 2A, the non-thermometer code is binary code. In the digital to analog converter circuit 210, the weights of the capacitors $C_M$ are encoded based on binary code, and thus the capacitance value of each capacitor $C_M$ is set to be 4 C. Similarly, in the digital to analog converter circuit 220, the weights of the capacitors $C_L$ are encoded based on binary code, and thus the capacitance values of the capacitors $C_L$ are set to be 2 C, 1 C, and 1 C, respectively.

The comparator circuit 230 is configured to generate a decision signal SD according to the signal 51. The SAR control logic circuit 240 is configured to perform the analog to digital conversion according to the decision signal SD, in order to sequentially generate the most significant bits B[0]-B[2] and the least significant bits C[0]—C[1] in the digital code DC. The implementations of the DEM circuit 250 can be understood with reference to the DEM circuit 100 in FIG. 1A. The DEM circuit 250 is configured to adjust the signal SS (i.e., operation S105-1 in FIG. 1B) when the SAR control logic circuit 240 generates the least significant bits C[0]—C[1]. Operations regarding herein will be described with reference to FIG. 2C.

Figure 2B:
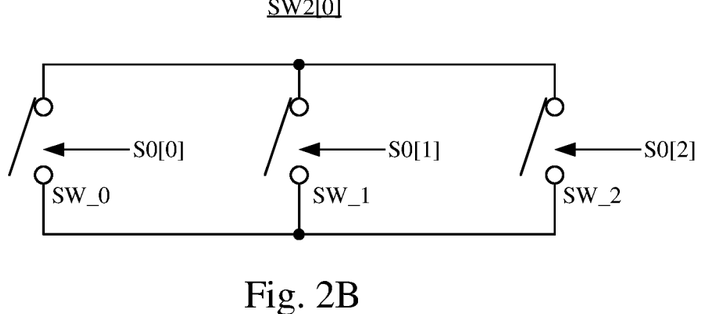
FIG. 2B shows a schematic diagram of one switching circuit in FIG. 2A according to some embodiments of the present disclosure.

FIG. 2B shows a schematic diagram of the switching circuit SW2[0] in FIG. 2A according to some embodiments of the present disclosure. The switching circuit SW2[0] includes switches SW_0-SW_2. First terminals of the switches SW_0-SW_2 are coupled to the switching circuit SW1[0] in FIG. 2A, and second terminals of the switches SW_0-SW_2 are coupled to the first terminal of the capacitor $C_M$ in FIG. 2A. The switch SW_0 is configured to be selectively turned on according to the control signal S0[0], the switch SW_1 is configured to be selectively turned on according to the control signal S0[1], and the switch SW_2 is configured to be selectively turned on according to the control signal S0[2]. The arrangements of the switching circuit SW2[1]-SW2[6] are the same as those of the switching circuit SW2[0], and thus the repetitious descriptions are not further given.

Figure 2C:
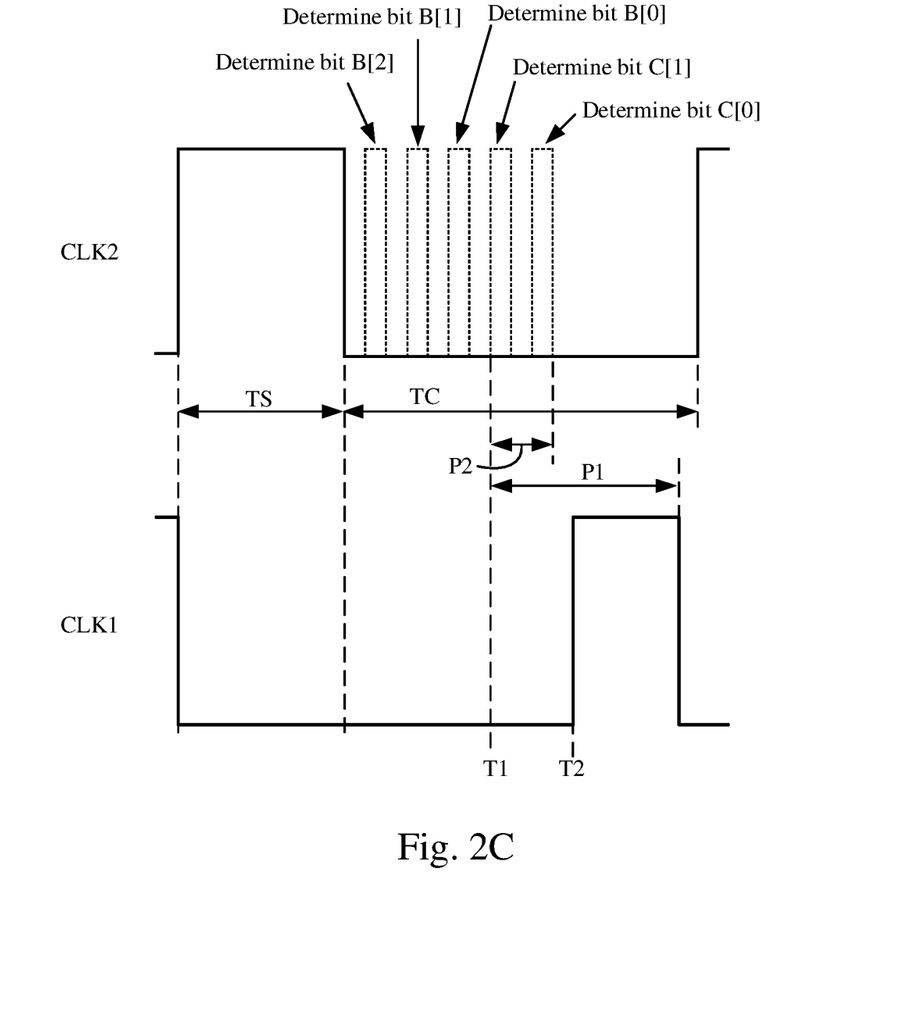
FIG. 2C shows a timing diagram of operations of the signal converter device in FIG. 2A according to some embodiments of the present disclosure.

Reference is made to FIG. 2A and FIG. 2C, and FIG. 2C shows a timing diagram of operations of the signal converter device 200 in FIG. 2A according to some embodiments of the present disclosure. During a sampling phase TS, the switch SW is turned on. As a result, the digital to analog converter circuit 210 and the digital to analog converter circuit 220 sample the input signal VIN. Afterwards, during a comparison phase TC, the digital to analog converter circuit 210 selects the corresponding capacitor(s) $C_M$ according to the pointer signal P[n−1] and the most significant bits B[0]-B[2] in a period (e.g., period T[n−1]), and utilizes the selected capacitor(s) $C_M$ to generate the signal component S11 according to the switching of the SAR control logic circuit 240. Meanwhile, the digital to analog converter circuit 220 generates the signal component S12 according to the switching of the SAR control logic circuit 240.

For ease of understanding, in FIG. 2C, pulses shown with dotted lines are given to indicate timings for operations of determining bits. During the comparison phase TC, the SAR control logic circuit 240 may determine a first bit (e.g., the most significant bit B[2]) in the digital code DC according to the decision signal SD, and switch the digital to analog converter circuit 210 correspondingly. In response to the switching of the digital to analog converter circuit 210, the comparator circuit 230 compare the updated signal S1 with the common mode voltage VCM again to generate a next decision signal SD. The SAR control logic circuit 240 may determine a second bit (e.g., the most significant bit B[1]) in the digital code DC according to this decision signal SD, and switch the digital to analog converter circuit 210 correspondingly. With the similar operations, the SAR control logic circuit 240 may determine a third bit (e.g., the most significant bit B[0]) in the digital code DC according to a next decision signal SD, and switch the digital to analog converter circuit 220 correspondingly. In response to the switching the digital to analog converter circuit 220, the comparator circuit 230 compares the updated signal S1 with the common mode voltage VCM again to generate a next decision signal SD. The SAR control logic circuit 240 determines a fourth bit (e.g., the least significant bit C[1]) in the digital code DC according this decision signal SD. With the same operation, the SAR control logic circuit 240 determines a fifth bit (e.g., the least significant bit C[0]) in the digital code DC according to a next decision signal SD.

Moreover, at time T1 (i.e., after the SAR control logic circuit 240 generates the most significant bits B[0]-B[2] in the period (e.g., period T[n−1])), the DEM circuit 250 start adjusting the signal SS. For example, the ALU circuit 110 may start performing operation S105-1 in FIG. 1B at time T1 to generate the signal SS. At time T2 (i.e., after the SAR control logic circuit 240 generates the least significant bits C[0]—C[1] in the period (e.g., period T[n−1])), the DEM circuit 250 may output the control signals S0[0]-S0[2], S1[0]-S1[2], S2[0]-S2[2], S3[0]-S3[2], S4[0]-S4[2], S5[0]-S5[2], and S6[0]-S6[2] according to the adjusted pointer signal P[n]. For example, at time T2, the clock signal CLK1 has a high level. In response to the clock signal CLK1, the register circuit 120 in FIG. 1A may output the signal SS to be the adjusted pointer signal P[n], and the decoder circuit 130 may decode the adjusted pointer signal P[n], in order to output the control signals S0[0]-S0[2], S1[0]-S1[2], S2[0]-S2[2], S3[0]-S3[2], S4[0]-S4[2], S5[0]-S5[2], and S6[0]-S6[2].

As shown in FIG. 2C, the operating phase P1 of the DEM circuit 250 is overlapped with the phase P2 for the SAR control logic circuit 240 to generate the least significant bits C[0]—C[1]. The DEM circuit 250 may adjust the signal SS during the phase P2 for the SAR control logic circuit 240 to generate the least significant bits C[0]—C[1] in the period (e.g., period T[n−1]), in order to generate the adjusted pointer signal P[n]. In other words, the DEM circuit 250 may perform operation S105-1 in FIG. 1B in the progress (i.e., between time T1 and time T2 in FIG. 2C) of the digital to analog converter circuit 220 processing the least significant bits C[0]—C[1] in the period (e.g., period T[n−1]), and perform operation S105-2 in FIG. 1B when the progress is completed (e.g., time T2). As a result, in a next period (e.g., period T[n]), the digital to analog converter circuit 210 may select the corresponding capacitor $C_M$ according to the adjusted pointer signal P[n] and the most significant bits B[0]-B[2] in the next period that are generated based on the adjusted pointer signal P[n], in order to generate the signal component S11. With the above arrangements, operations of the DEM circuit 250 do not significantly decrease the operating speed of the signal converter device 200.

Figure 2D:
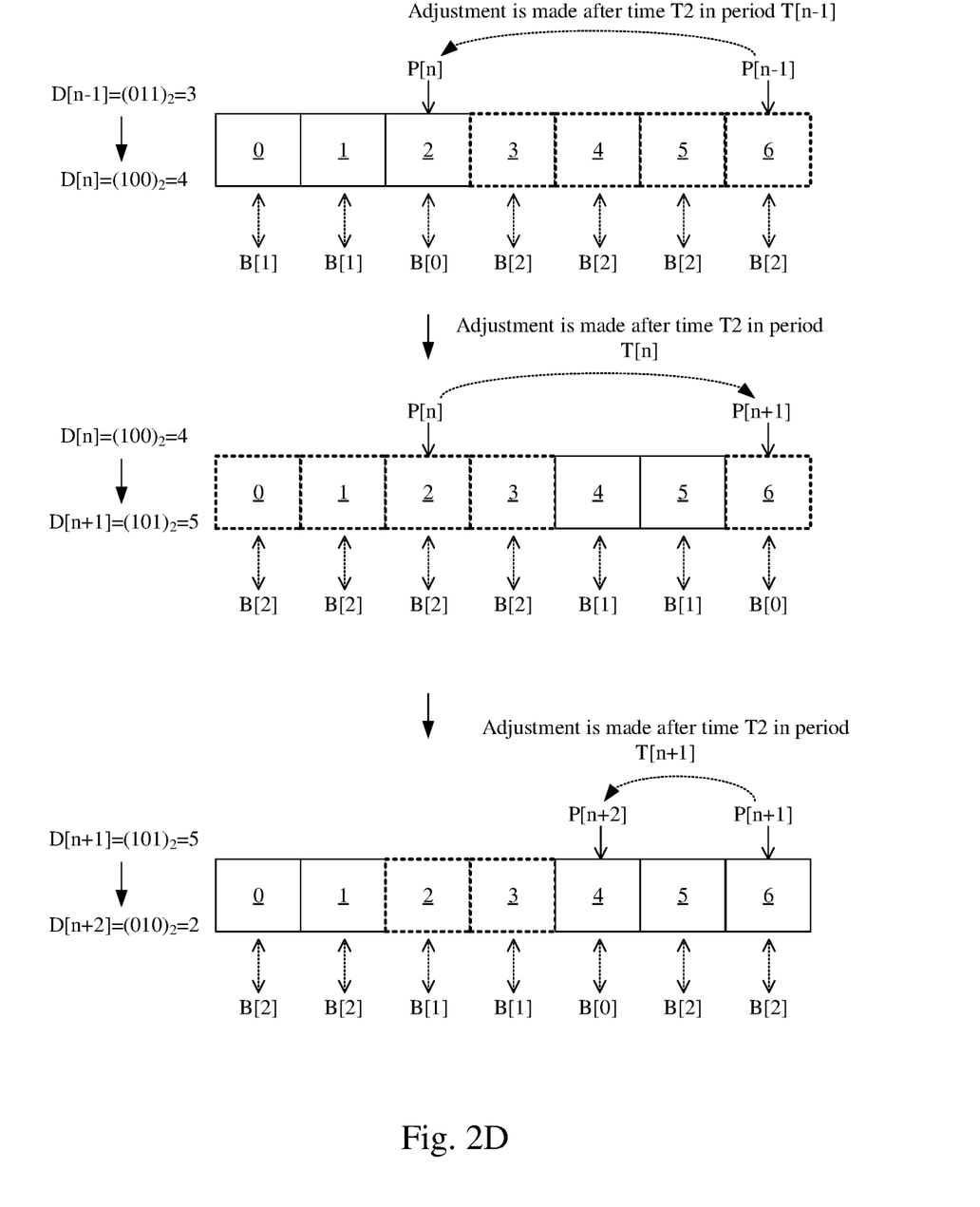
FIG. 2D shows a schematic diagram of operations of the DEM circuit in FIG. 2A according to some embodiments of the present disclosure.

FIG. 2D shows a schematic diagram of operations of the DEM circuit 250 in FIG. 2A according to some embodiments of the present disclosure. In some embodiments, the DEM circuit 250 is configured to adjust the pointer signal based on a non-thermometer code mode. In some embodiments, the non-thermometer code mode may be a binary mode (as shown in FIG. 2D). In some other embodiments, the non-thermometer code mode may be a non-binary mode having a digital code error correction mechanism. As mentioned above, the most significant bits B[0]-B[2] generated in the period T[n] are labeled as the digital code D[n]. In other words, the digital code D[n] may be expressed as follows: D[n]=(B[2], B[1], B[0])$_2$. In some embodiments, the pointer signal P[n] is configured to indicate a corresponding relation between a particular high-weight bit (which is, in this example, the most significant bit B[0]) and the capacitor $C_M$, in order to define the component corresponding to that high weight bit to be a reference starting point of the weights in the binary mode. Components 0-6 respectively corresponds to seven capacitors $C_M$ in the digital to analog converter circuit 210. For example, the component 0 corresponds to the capacitor $C_M$ coupled to the switching circuit SW2[0], and the component 1 corresponds to the capacitor $C_M$ coupled to the switching circuit SW2[1]. With this analogy, the corresponding relations between the components 0-6 and the seven capacitors $C_M$ in FIG. 2A can be understood. Based on the weights in the binary mode, the most significant bit B[2] corresponds to four capacitors $C_M$, the most significant bit B[1] corresponds to two capacitors $C_M$, and the most significant bit B[0] corresponds to one capacitor $C_M$.

During the period T[n−1] (e.g., the comparison phase TC for generating the digital code D[n−1]), the pointer signal P[n−1] has a value that indicates the component 6, and the SAR control logic circuit 240 sequentially determines that the most significant bits B[2], B[1], and B[0] are the logic values of 0, 1, and 1. In other words, the digital code D[n−1] is (011)$_2$, and the corresponding signal value of the digital code D[n−1] is 3.

During the period T[n−1], the ALU circuit 110 sums up the most significant bits B[0]-B[2] and the pointer signal P[n−1] in the period T[n−1], in order to generate the adjusted pointer signal P[n]. For example, as the pointer signal P[n−1] has the value indicating the component 6 (i.e., the maximum value), the ALU circuit 110 may sum up the pointer signal P[n−1] and the digital code D[n−1] and perform an overflow calculation, in order to determine that the adjusted pointer signal P[n] is 2 (i.e., P[n]=P[n−1]+D[n−1]−7=6+3−7=2). As the digital code D[n−1] is 3, it indicates that the shift amount of the pointer signal is 3. Therefore, the adjusted pointer signal P[n] is changed to has a value indicating the component 2. As a result, as the adjusted pointer signal P[n] indicates that the most significant bit B[0] corresponds to the component 2, based on the bit order of the binary mode, the components 0 and 1 correspond to the most significant bit B[1], and the remaining components 3-6 correspond to most significant bit B[2].

Moreover, during a period T[n] (e.g., the comparison phase TC for generating the digital code D[n]), the SAR control logic circuit 240 sequentially determines that the most significant bits B[2], B[1], and B[0] are the logic values of 1, 0, and 0. In other words, the digital code D[n] is (100)$_2$, which corresponds to the signal value of 4. As the most significant bit B[2] is the logic value of 1, the components 3-6 corresponding to the most significant bit B[2] will be selected (shown with dotted lines), in order to generate the signal component S11 according to the most significant bits B[0]-B[2].

During the period T[n], the ALU circuit 110 sums up the most significant bits B[0]-B[2] and the pointer signal P[n] in the period T[n], in order to generate the adjusted pointer signal P[n+1]. For example, as the pointer signal P[n] has a value indicating the component 2 (i.e., the value of the pointer signal P[n] is 2), the ALU circuit 110 may sum up the pointer signal P[n] and the digital code D[n], in order to determine that the adjusted pointer signal P[n+1] is 6 (i.e., P[n+1]=P[n]+D[n]=2+4=6). As the value of the digital code D[n] is 4, it indicates that the shift amount of the pointer signal is 4. Therefore, the adjusted pointer signal P[n+1] is changed to have the value indicating the component 6. As a result, as the adjusted pointer signal P[n+1] indicates that the most significant bit B[0] corresponds to the component 6, based on the bit order of binary mode, the components 4-5 correspond to the most significant bit B[1], and the remaining components 0-3 correspond to the most significant bit B[2].

Moreover, during the period T[n+1] (e.g., the comparison phase TC for generating the digital code D[n+1]), the SAR control logic circuit 240 sequentially determines that the most significant bits B[2], B[1], and B[0] are the logic values of 1, 0, and 1. In other words, the digital code D[n+1] is (101)$_2$, which corresponds to the signal value of 5. As the most significant bits B[2] and B[0] are the logic values of 1, the components 0-3 corresponding to the most significant bit B[2] and the component 6 corresponding to the most significant bit B[0] will be selected (shown with dotted lines), in order to generate the signal component S11 according to the most significant bits B[0]-B[2].

During a period T[n+1], the ALU circuit 110 sums up the most significant bits B[0]-B[2] and the pointer signal P[n+1] in the period T[n+1], in order to generate the adjusted pointer signal P[n+2]. For example, as the pointer signal P[n+1] in the previous period has the value indicating the component 6 (i.e., the pointer signal P[n+1] has the maximum value), the ALU circuit 110 may sum up the pointer signal P[n+1] and the digital code D[n+1] and perform the overflow calculation, in order to determine that the adjusted pointer signal P[n+2] is 4 (i.e., P[n+2]=P[n+1]+D[n+1]−7=6+5−7=4). As the digital code D[n+1] is 5, it indicates that the shift amount of the pointer signal is 5. Therefore, the adjusted pointer signal P[n+2] is changed to have the value indicating the component 4. As a result, as the adjusted pointer signal P[n+2] indicates that the most significant bit B[0] corresponds to the component 4, according to the bit order of the binary mode, the components 2-3 correspond to the most significant bit B[1], and the remaining components 0-1 and 5-6 correspond to the most significant bit B[2].

Furthermore, during a period T[n+2] (e.g., the comparison phase TC for generating the digital code D[n+2]), the SAR control logic circuit 240 sequentially determines that the most significant bits B[2], B[1], and B[0] are the logic values of 0, 1, and 0. In other words, the digital code D[n+2] is (010)$_2$, which corresponds to the signal value of 2. As the most significant bit B[1] is the logic value of 1, the components 2-3 corresponding to the most significant bit B[1] will be selected (shown with dotted lines), in order to generate the signal component S11 according to the most significant bits B[0]-B[2].

With the above arrangements, the DEM circuit 250 may generate the adjusted pointer signal P[n] according to the most significant bits B[0]-B[2] and the pointer signal P[n−1] in a previous period (e.g., period T[n−1]), and generate the signal component S11 according to the adjusted pointer signal P[n] and the digital code D[n] in a current period (e.g., period T[n]). As a result, the digital to analog converter circuit 210 is able to utilize different capacitors C$_M$ to generate the signal component S11, in order to decrease impacts from mismatches among the capacitors C$_M$. Moreover, as the pointer signal P[n] is updated by summing up the most significant bits B[0]-B[2] in the previous period, impacts from mismatches among the capacitors C$_M$ in the signal converter device 200 are equivalently improved with an effect of first-order shaping.

For illustrative purposes, the above operations are illustrated with examples using the SAR analog to digital converter, but the present disclosure is not limited thereto. Various analog to digital converter that are able to be applied with the DEM circuit 100 in FIG. 1A are within the contemplated scope of the present disclosure.

Figure 3:
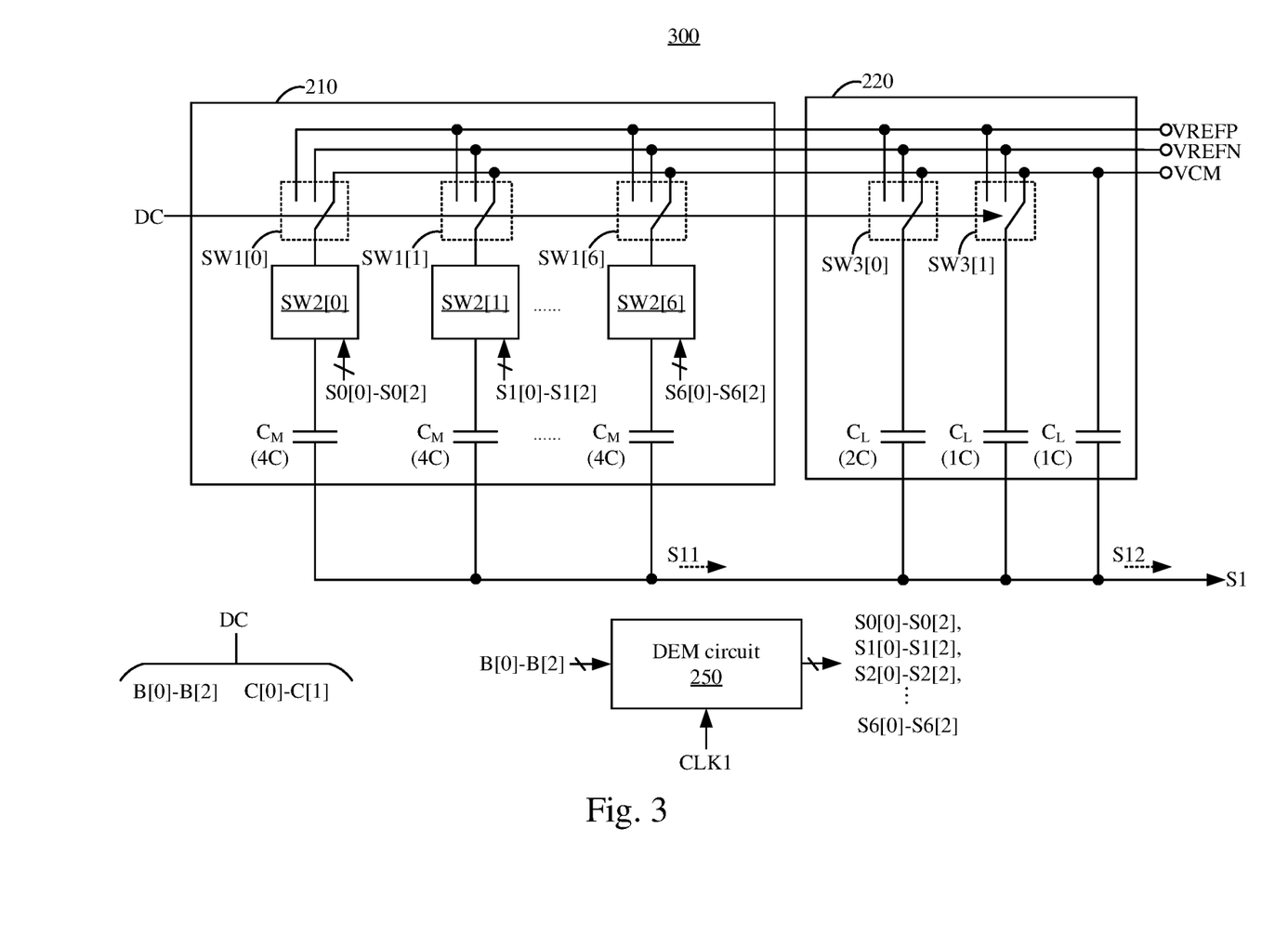
FIG. 3 shows a schematic diagram of a signal converter device according to some embodiments of the present disclosure.

FIG. 3 shows a schematic diagram of a signal converter device 300 according to some embodiments of the present disclosure. In this example, the signal converter device 300 is a digital to analog converter device, which is configured to convert the digital code DC into a corresponding analog signal (e.g., signal S1). The signal converter device 300 includes the digital to analog converter circuit 210, the digital to analog converter circuit 220, and the DEM circuit 250. The arrangements about the digital to analog converter circuit 210, the digital to analog converter circuit 220, and the DEM circuit 250 can be understood with reference to FIG. 2A, FIG. 2D, and FIG. 1A, and thus the repetitious descriptions are not further given.

Similar to examples in FIG. 2D, the DEM circuit 250 may start adjusting the signal SS in the progress of the digital to analog converter circuit 220 converting the least significant bits C[0]—C[1] into the signal component S12, and update the pointer signal P[n] at time T2. For example, in the period T[n−1], the most significant bits B[2], B[1], and B[0] in the digital code DC sequentially are the logic values of 0, 1, and 1 (which corresponds to the signal value of 3), and the pointer signal P[n−1] has the maximum value (e.g., 6, which indicates the component 6). In the progress of the least significant bits C[0]—C[1] being converted into the signal component S12, the DEM circuit 250 may sum up the signal value of 3 and the pointer signal P[n−1] and perform the overflow calculation, in order to adjust the signal SS. After the progress is completed, the DEM circuit 250 may generate the adjusted pointer signal P[n] having the signal value of 2 according to the signal SS. As a result, according to the most significant bits B[0]-B[2] in the next digital code DC and the adjusted pointer signal P[n], the digital to analog converter circuit 210 may select the corresponding capacitors C$_M$ to convert the most significant bits B[0]-B[2], in order to generate the signal component S11.

For illustrative purposes, the above examples are given with reference to a capacitive digital to analog converter, but the present disclosure is not limited thereto. Various digital to analog converters (which include, for example, a resistive digital to analog converter, a current-steering digital to analog converter, or the like) that are able to be applied with the DEM circuit 100 in FIG. 1A are within the contemplated scope of the signal converter device of the present disclosure. In addition, the signal converter device 200 or 300 are illustrated with the single-ended signaling application, but the present disclosure is not limited thereto. In some other embodiments, the signal converter device 200 or 300 may be adjusted to be applied with a differential signaling application.

Moreover, the above examples are given with reference to the DEM circuit 250 that operates in the binary mode. As mentioned above, the DEM circuit 250 may operate in a non-thermometer code mode. It is understood that, in different embodiments, if the DEM circuit 250 operates in the non-thermometer code mode (e.g., non-binary mode), the weights of the components in the digital to analog converter circuit 210 (and/or the digital to analog converter circuit 220) can be encoded with the corresponding digital code (e.g., non-binary code).

The number of circuits and bits and the corresponding relations between the pointer signal and the high-weight bits in the above examples are given for illustrative purposes, and the present disclosure is not limited thereto. According to requirements of practical applications, the number of circuits and bits and the corresponding relations between the pointer signal and the high-weight bits in the above examples can be adjusted correspondingly.

As described above, the DEM circuit, the DEM method, and the signal converter device in some embodiments of the present disclosure may utilize the high-weight bits and the pointer signal in a previous period to update the pointer signal. As a result, the linearity of the signal converter device can be improved, and an effect of first-order shaping is introduced to the signal converter device. Furthermore, if the signal converter device is a SAR analog to digital converter, the DEM circuit may operate in the phase for processing the low-weight bits. As a result, the DEM circuit does not decrease the operating speed of the SAR analog to digital converter significantly.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A signal converter device, comprising:
    a first digital to analog converter circuit comprising a plurality of components, wherein the first digital to analog converter circuit is configured to utilize the plurality of components to generate a first signal component of a first signal in response to a plurality of first bits;
    a second digital to analog converter circuit configured to generate a second signal component of the first signal in response to a second bit, wherein weights corresponding to the plurality of first bits are higher than a weight corresponding to the second bit; and
    a dynamic element matching circuit configured to generate an adjusted pointer signal in response to a pointer signal and the plurality of first bits in a previous period, in order to set corresponding relations between the plurality of components and the plurality of first bits.

2. The signal converter device of claim 1, wherein the dynamic element matching circuit is configured to sum up the pointer signal in the previous period and the plurality of first bits in the previous period to adjust the pointer signal, in order to generate the adjusted pointer signal.

3. The signal converter device of claim 1, wherein the dynamic element matching circuit comprises:
    an arithmetic logic unit circuit configured to sum up the plurality of first bits in the previous period and the pointer signal in the previous period, in order to generate a second signal;
    a register circuit configured to output the second signal to be the adjusted pointer signal according to a clock signal; and
    a decoder circuit configured to decode the adjusted pointer signal to be a plurality of control signals, wherein the first digital to analog converter circuit is further configured to select the plurality of components according to the plurality of control signals.

4. The signal converter device of claim 3, wherein the register circuit is configured to output the adjusted pointer signal after a successive approximation register analog to digital circuit generates the second bit in the previous period.

5. The signal converter device of claim 1, further comprising:
    a comparator circuit configured to generate a decision signal; and
    a successive approximation register control logic circuit configured to generate the plurality of first bits and the second bit according to the decision signal.

6. The signal converter device of claim 5, wherein, the dynamic element matching circuit is configured to sum up the pointer signal and the plurality of first bits in the previous period during a progress of the successive approximation register control logic circuit generating the second bit in the previous period, and is configured to output the adjusted pointer signal after the progress is completed.

7. The signal converter device of claim 5, wherein the dynamic element matching circuit is configured to start summing up the pointer signal and the plurality of first bits in the previous period after the successive approximation register control logic circuit generates the plurality of first bits in the previous period.

8. The signal converter device of claim 1, wherein the dynamic element matching circuit is configured to sum up the pointer signal and the plurality of first bits in the previous period during a progress of the second digital to analog converter circuit processing the second bit in the previous period, and is configured to output the adjusted pointer signal after the progress is completed.

9. The signal converter device of claim 1, wherein the dynamic element matching circuit is configured to adjust the pointer signal based on a non-thermometer code mode.

10. The signal converter device of claim 1, wherein the first digital to analog converter circuit is a non-thermometer code digital to analog converter circuit.

11. A dynamic element matching circuit, comprising:
    an arithmetic logic unit circuit configured to sum up a plurality of most significant bits of a digital code in a previous period and a pointer signal in the previous period, in order to generate a first signal;
    a register circuit configured to output the first signal to be an adjusted pointer signal according to a clock signal; and
    a decoder circuit configured to decode the adjusted pointer signal to be a plurality of control signals, wherein the plurality of control signals are configured to set corresponding relations of a plurality of components of a first digital to analog converter circuits and the plurality of most significant bits, in order to utilize the plurality of components to convert the plurality of most significant bits.

12. The dynamic element matching circuit of claim 11, wherein the arithmetic logic unit circuit is configured to sum up the pointer signal in the previous period and the plurality of most significant bits in the previous period during a progress of a successive approximation register analog to digital converter circuit generating a least significant bit of the digital code in the previous period.

13. The dynamic element matching circuit of claim 11, wherein the first digital to analog converter circuit is a non-thermometer code digital to analog converter circuit.

14. The dynamic element matching circuit of claim 11 wherein the arithmetic logic unit circuit is configured to start summing up the pointer signal in the previous period and the plurality of most significant bits in the previous period after the first digital to analog converter circuit generates the plurality of most significant bits in the previous period.

15. The dynamic element matching circuit of claim 11, wherein the arithmetic logic unit circuit is configured to sum up the pointer signal in the previous period and the plurality of most significant bits in the previous period during a progress of a second digital to analog converter circuit processing a least significant bit of the digital code in the previous period.

16. A dynamic element matching method, comprising:
sumning up a plurality of most significant bits of a digital code in a previous period and a pointer signal in the previous period, in order to generate a first signal;
outputting the first signal to be an adjusted pointer signal according to a clock signal; and
decoding the adjusted pointer signal to be a plurality of control signals,
wherein the plurality of control signals are configured to set corresponding relations of a plurality of components of a first digital to analog converter circuits and the plurality of most significant bits, in order to utilize the plurality of components to convert the plurality of most significant bits.

17. The dynamic element matching method of claim 16, wherein summing up the plurality of most significant bits of the digital code in the previous period and the pointer signal in the previous period, in order to generate the first signal comprises:
summing up the pointer signal in the previous period and the plurality of most significant bits in the previous period during a progress of a successive approximation register analog to digital converter circuit generating a least significant bit of the digital code in the previous period.

18. The dynamic element matching method of claim 16, wherein summing up the plurality of most significant bits of the digital code in the previous period and the pointer signal in the previous period, in order to generate the first signal comprises:
starting summing up the pointer signal in the previous period and the plurality of most significant bits in the previous period after the first digital to analog converter circuit generates the plurality of most significant bits in the previous period.

19. The dynamic element matching method of claim 16, wherein summing up the plurality of most significant bits of the digital code in the previous period and the pointer signal in the previous period, in order to generate the first signal comprises:
summing up the pointer signal in the previous period and the plurality of most significant bits in the previous period during a progress of a second digital to analog converter circuit processing a least significant bit of the digital code in the previous period.

20. The dynamic element matching method of claim 16, wherein the first digital to analog converter circuit is a non-thermometer code digital to analog converter circuit.

* * * * *